(12) United States Patent
Sakamoto et al.

(10) Patent No.: US 11,508,799 B2
(45) Date of Patent: Nov. 22, 2022

(54) DISPLAY DEVICE COMPRISING FRAME REGION SURROUNDING DISPLAY REGION

(71) Applicant: SHARP KABUSHIKI KAISHA, Sakai (JP)

(72) Inventors: Mayuko Sakamoto, Sakai (JP); Tamotsu Sakai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 177 days.

(21) Appl. No.: 17/040,375

(22) PCT Filed: Mar. 28, 2018

(86) PCT No.: PCT/JP2018/013031
§ 371 (c)(1),
(2) Date: Sep. 22, 2020

(87) PCT Pub. No.: WO2019/186845
PCT Pub. Date: Oct. 3, 2019

(65) Prior Publication Data
US 2021/0057509 A1     Feb. 25, 2021

(51) Int. Cl.
*H01L 27/32*     (2006.01)
*H01L 51/00*     (2006.01)
*H01L 51/56*     (2006.01)

(52) U.S. Cl.
CPC ........ *H01L 27/3276* (2013.01); *H01L 51/003* (2013.01); *H01L 51/0097* (2013.01); *H01L 51/56* (2013.01); *H01L 2227/326* (2013.01); *H01L 2251/5338* (2013.01); *H01L 2251/566* (2013.01)

(58) Field of Classification Search
None
See application file for complete search history.

(56) References Cited

U.S. PATENT DOCUMENTS

| 8,847,246 | B2* | 9/2014 | Ryu | H01L 51/524 |
| | | | | 257/E27.121 |
| 2006/0284202 | A1 | 12/2006 | Nakane et al. | |
| 2008/0204618 | A1 | 8/2008 | Jung et al. | |
| 2008/0220684 | A1 | 9/2008 | Nakane et al. | |
| 2010/0163284 | A1 | 7/2010 | Tanahara | |
| 2020/0312943 | A1* | 10/2020 | Jo | H01L 27/124 |
| 2021/0193787 | A1* | 6/2021 | Won | H01L 51/5284 |

FOREIGN PATENT DOCUMENTS

| JP | 2007-034275 A | 2/2007 |
| JP | 2008-203856 A | 9/2008 |
| JP | 2010-152091 A | 7/2010 |

* cited by examiner

Primary Examiner — J. E. Schoenholtz
(74) Attorney, Agent, or Firm — ScienBiziP, P.C.

(57) ABSTRACT

A flexible organic EL display device includes a plurality of short ring wiring lines. Each of the plurality of short ring wiring lines contacts a flattening film that is a resin layer on an end face of a terminal portion region in the flexible organic EL display device.

18 Claims, 7 Drawing Sheets

DISPLAY DEVICE COMPRISING FRAME REGION SURROUNDING DISPLAY REGION

TECHNICAL FIELD

The disclosure relates to a display device and a manufacturing method of the display device.

BACKGROUND ART

PTL 1 describes that, in a division step of dividing a large substrate including an organic EL element, division of a short ring portion is performed, and the number of times of division is also reduced while a short circuit caused by static electricity is reliably prevented, thereby improving productivity.

CITATION LIST

Patent Literature

PTL 1: JP 2007-34275A (published on Feb. 8, 2007).

SUMMARY

Technical Problem

However, in a case of the configuration and a manufacturing method disclosed in PTL 1, a film composition at a location where division of the short ring portion is performed is not taken into consideration. When the short ring portion is divided by a laser, a temperature rise instantaneously occurs in a divided portion. Thus, when the short ring portion to be divided is formed of a metal film and is sandwiched between an inorganic film in a lower layer and an inorganic film in an upper layer, a crack is more likely to be caused due to a difference in linear expansion coefficient.

In this way, when a crack is generated, moisture, oxygen, or the like easily penetrates into a terminal portion and the organic EL element through this crack, and thus there is a problem in that reliability of the terminal portion and the organic EL element is adversely affected.

The disclosure has been made in view of the above-described problem, and aims to provide a display device that suppresses generation of a crack at a location where division is performed and a manufacturing method of the display device.

Solution to Problem

In order to solve the above-described problem, a display device according to the disclosure includes: a display region; a frame region surrounding the display region; and a terminal portion region formed at an end portion of the frame region, wherein a plurality of terminal portions that input a signal from the outside, a plurality of first lead wiring lines extending from the plurality of terminal portions, and a plurality of second lead wiring lines extending from the plurality of terminal portions to the display region are included in the terminal portion region, each of the plurality of first lead wiring lines extends in a direction opposite to a direction in which each of the plurality of second lead wiring lines extends, and intersects an end face of the terminal portion region, and at least one of an upper layer and a lower layer in contact with each of the plurality of first lead wiring lines on the end face of the terminal portion region is a resin layer.

According to the above-described configuration, at least one of the upper layer and the lower layer in contact with each of the plurality of first lead wiring lines on the end face of the terminal portion region is a resin layer, and thus generation of a crack in the end face of the terminal portion region can be suppressed.

In order to solve the above-described problem, a manufacturing method of a display device according to the disclosure includes a step of dividing, in a terminal portion region formed at an end portion of a frame region, a display device including a display region, the frame region surrounding the display region, and the terminal portion region, wherein, in the step of dividing the display device in the terminal portion region, the terminal portion region is divided, a portion in which at least one of an upper layer and a lower layer in contact with each of a plurality of wiring lines is a resin layer being included in a film composition of a cross section generated by the division.

According to the above-described method, in the step of dividing the display device in the terminal portion region, the terminal portion region is divided such that the portion in which at least one of the upper layer and the lower layer in contact with each of the plurality of wiring lines is a resin layer is included in the film composition of the cross section generated by the division, and thus generation of a crack at a location where the division is performed can be suppressed.

Advantageous Effects of Disclosure

According to an aspect of the disclosure, a display device that suppresses generation of a crack at a location where division is performed and a manufacturing method of the display device can be provided.

DESCRIPTION OF EMBODIMENTS

Figure 1:
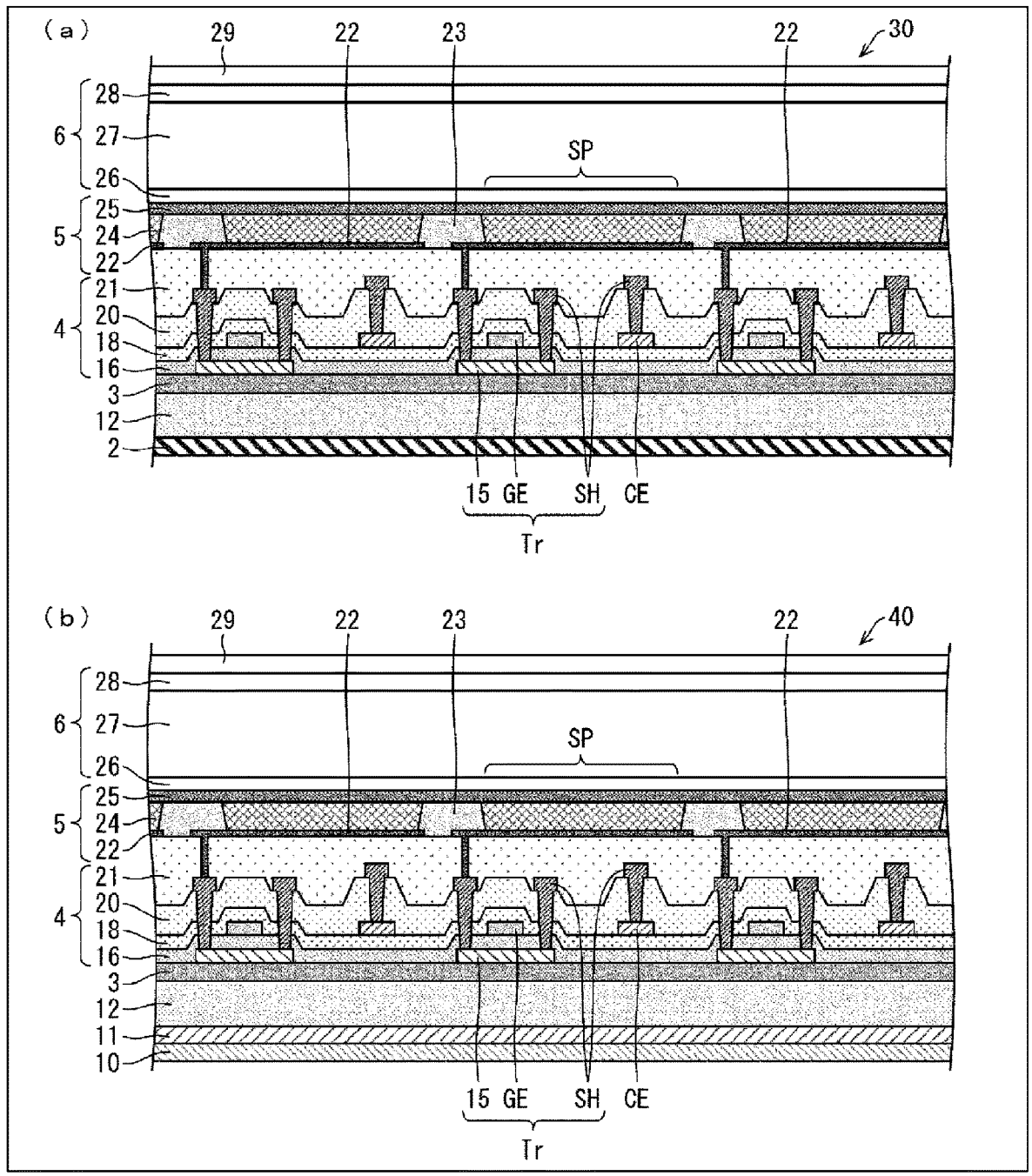
FIG. 1(a) is a cross-sectional view of a region including an organic EL element in a carrier glass substrate including a plurality of organic EL elements.
FIG. 1(b) is a cross-sectional view of a region including an organic EL element in a large film substrate including a plurality of organic EL elements.

Embodiments of the disclosure are described below with reference to FIG. 1 to FIG. 7. Hereinafter, for convenience of description, components having the same functions as those described in a specific embodiment are denoted by the same reference numerals, and descriptions thereof may be omitted.

Note that, in each embodiment below, description is made of an organic electro luminescence (EL) element as an example of a display element (optical element), but is not limited thereto, and may be, for example, a reflective-type liquid crystal display element in which luminance and transmittance are controlled by a voltage and background light is not required.

The display element (optical element) is an optical element whose luminance and transmittance are controlled by an electric current, and examples of the electric current-controlled optical element include an organic electro luminescence (EL) display provided with an organic light emitting diode (OLED), an EL display such as an inorganic EL display provided with an inorganic light emitting diode, or a quantum dot light emitting diode (QLED) display provided with a QLED.

First Embodiment

In the following, a flexible organic EL display device 1 according to a first embodiment of the disclosure will be described with reference to FIG. 1 to FIG. 4, and a flexible organic EL display device 110 according to a comparative example will be described with reference to FIG. 5.

(a) of FIG. 1 is a cross-sectional view of a region including an organic EL element in a carrier glass substrate 30 including a plurality of organic EL elements. (b) of FIG. 1 is a cross-sectional view of a region including the organic EL element in a large film substrate 40 including a plurality of organic EL elements.

Note that the size of the large film substrate 40 may be larger than the size of the flexible organic EL display device 1, and the number of flexible organic EL display devices 1 acquired from one large film substrate 40 can be determined as appropriate. Therefore, the size of the large film substrate 40 may be larger than or equal to the size of a sixth generation substrate, and may be smaller than the size of the sixth generation substrate.

Steps up to a flexibility step in steps for manufacturing the flexible organic EL display device 1 will be described with reference to (a) of FIG. 1 and (b) of FIG. 1.

First, a resin layer 12 is formed on a carrier glass substrate 2 that is a transparent support substrate to be peeled and replaced with a film substrate 10 in a post step. Next, a barrier layer 3 is formed. Next, a TFT layer 4 is formed. Next, an organic EL element layer 5 that is a light-emitting element layer is formed as a display element. Next, a sealing layer 6 is formed. Next, an upper face film 29 is bonded to the sealing layer 6 to form the carrier glass substrate 30 including the plurality of organic EL elements illustrated in (a) of FIG. 1. Next, a lower face of the resin layer 12 is irradiated with laser light through the carrier glass substrate 2 to reduce a bonding force between the carrier glass substrate 2 and the resin layer 12, and the carrier glass substrate 2 is peeled from the resin layer 12. A plurality of steps of peeling the carrier glass substrate 2 from the resin layer 12 are also referred to as a Laser Lift Off step (LLO step). Next, the film substrate 10 is bonded, via an adhesive layer 11, to the surface of the resin layer 12 from which the carrier glass substrate 2 is peeled to form the large film substrate 40 including the plurality of organic EL elements illustrated in (b) of FIG. 1.

Figure 2:
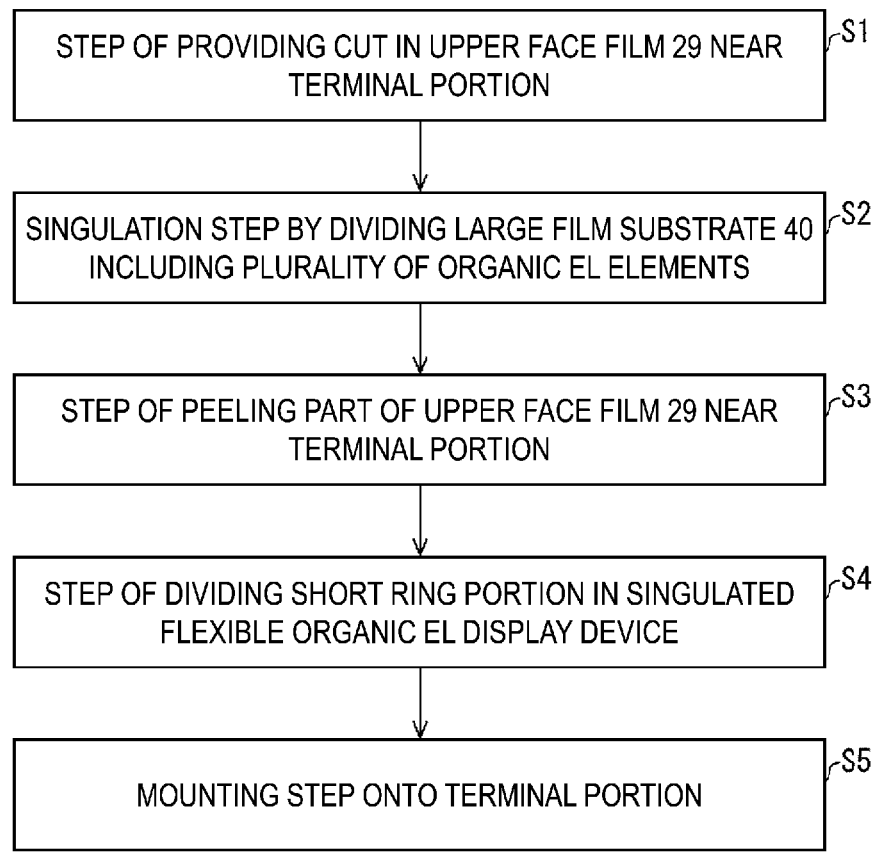
FIG. 2 is a diagram illustrating singulation of the large film substrate including the plurality of organic EL elements and a mounting step onto a terminal portion after the singulation.

FIG. 2 is a diagram illustrating singulation of the large film substrate 40 including the plurality of organic EL elements and a mounting step onto a terminal portion after the singulation.

Figure 3:
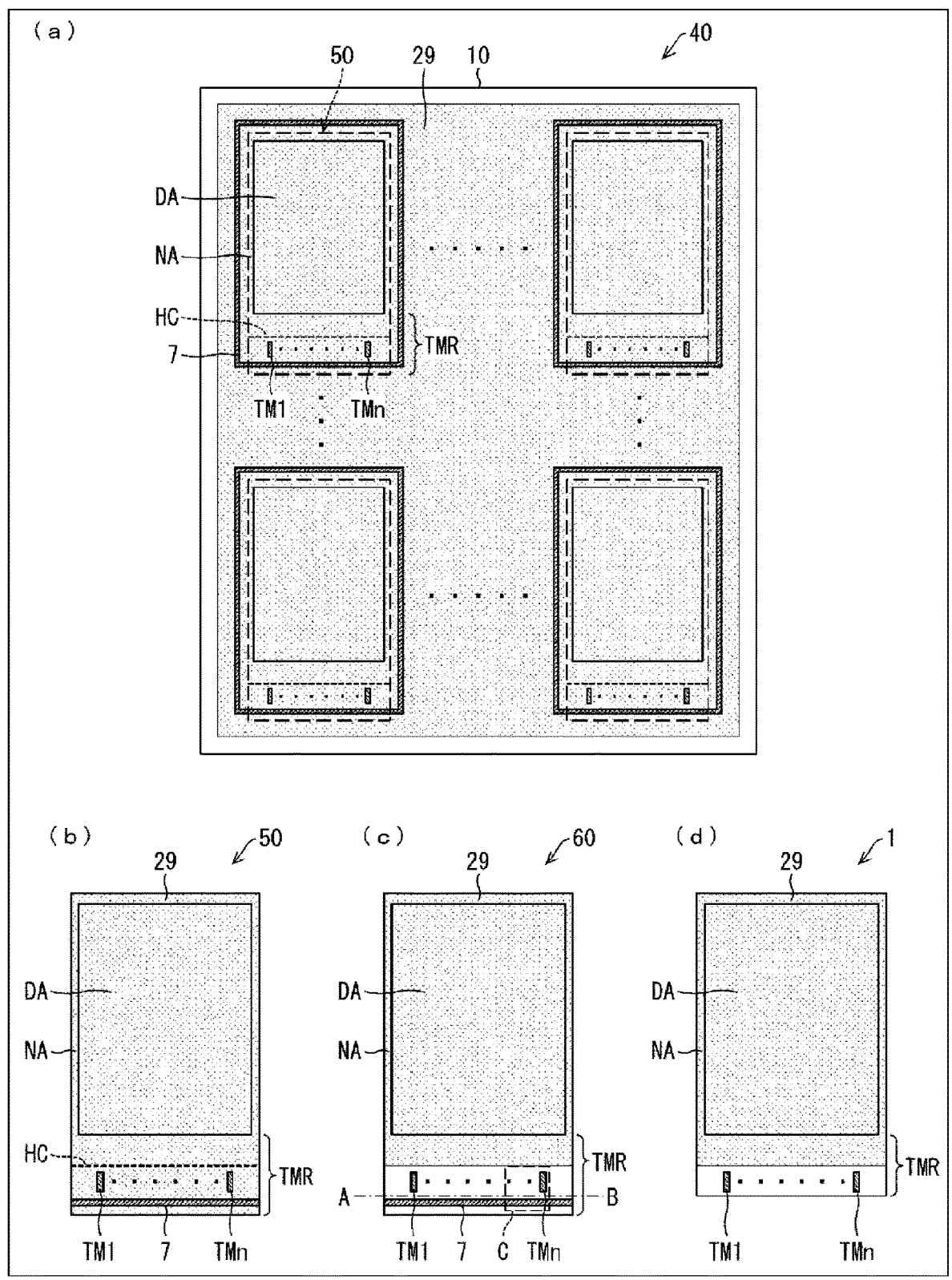
FIG. 3(a) is a diagram illustrating a step of providing a cut in an upper face film of the large film substrate including the plurality of organic EL elements.
FIG. 3(b) is a diagram illustrating a singulation step of the large film substrate including the plurality of organic EL elements.
FIG. 3(c) is a diagram illustrating a step of peeling a part of the upper face film.
FIG. 3(d) is a diagram illustrating a step of dividing a short ring portion and acquiring a flexible organic EL display device according to a first embodiment.

(a) of FIG. 3 is a diagram illustrating a step of providing a cut in the upper face film 29 of the large film substrate 40 including the plurality of organic EL elements. (b) of FIG. 3 is a diagram illustrating a singulation step of the large film substrate 40 including the plurality of organic EL elements. (c) of FIG. 3 is a diagram illustrating a step of peeling a part of the upper face film 29. (d) of FIG. 3 is a diagram illustrating a step of dividing a short ring portion and acquiring the flexible organic EL display device 1 according to the first embodiment.

Figure 4:
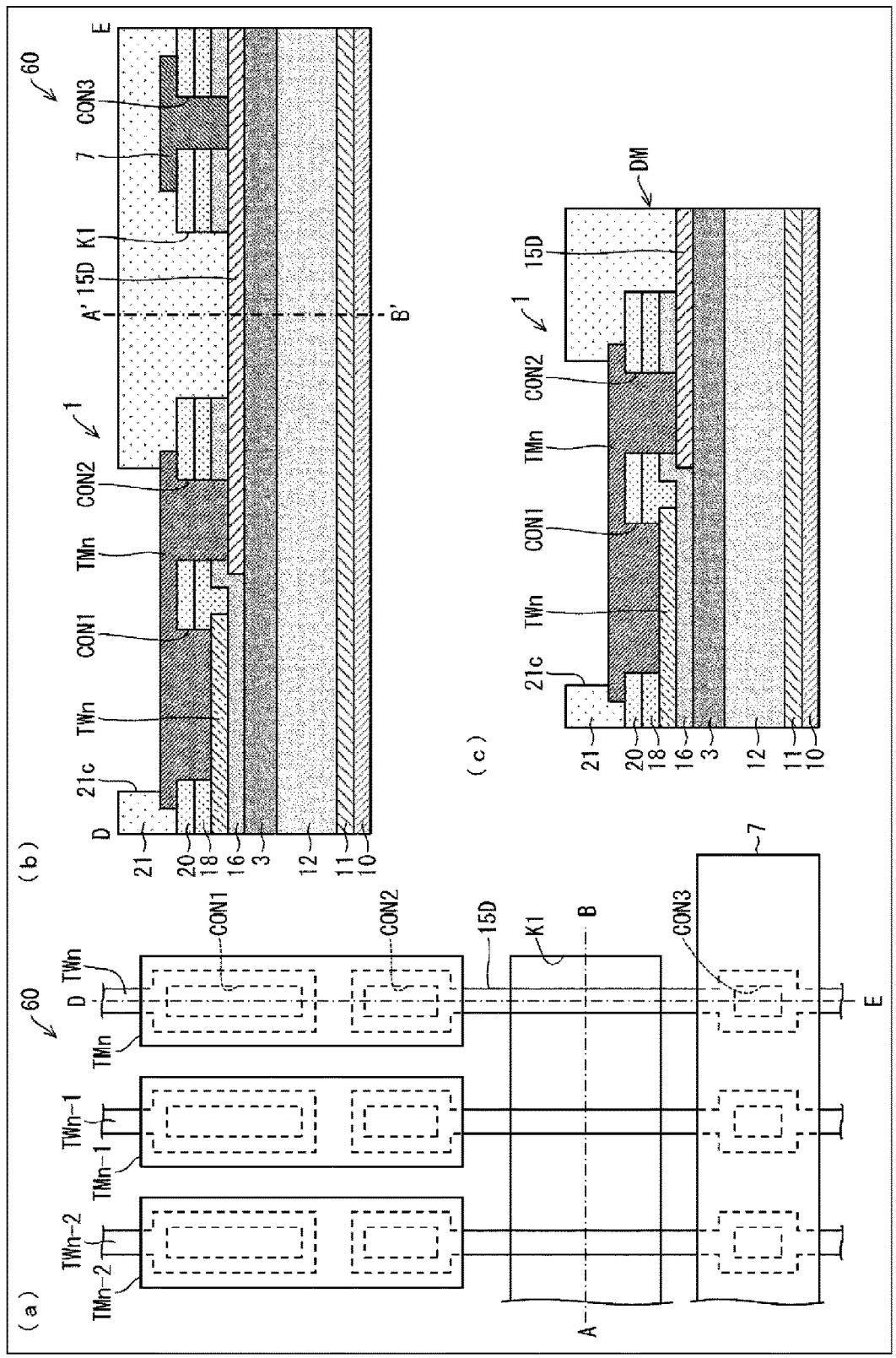
FIG. 4(a) is a partially enlarged view of a C portion in (c) of FIG. 3.
FIG. 4(b) is a cross-sectional view taken along a line D-E in FIG. 4(a).
FIG. 4(c) is a diagram illustrating a schematic configuration of the flexible organic EL display device including an end face of a terminal portion region formed by dividing the flexible organic EL display device illustrated in FIG. 4(b) by a laser taken along a line A'-B' in the diagram that is a portion including the short ring portion.

Note that the short ring portion includes a short ring 7 having a frame shape illustrated in (a) of FIG. 3 and a plurality of short ring wiring lines 15D electrically connected to the short ring 7 illustrated in (a) of FIG. 4, and is electrically connected to terminal portions TM1 to TMn. For example, the short ring portion suppresses a short circuit caused by static electricity that may occur in the terminal portions TM1 to TMn during the step of peeling a part of the upper face film 29, for example.

As illustrated in FIG. 2 and (a) of FIG. 3, in a step (step S1) of providing a cut HC in the upper face film 29 near the terminal portions TM1 to TMn of the large film substrate 40 including the plurality of organic EL elements, the cut HC is provided in the upper face film 29 in each terminal portion region TMR and between the terminal portions TM1 to TMn and a display region DA. Note that a schematic configuration of the terminal portion region TMR in a state where the upper face film 29 is provided with the cut HC is a configuration in which the upper face film 29 is further provided on a flattening film 21 and the terminal portion TMn in a configuration illustrated in (b) of FIG. 4.

In the present embodiment, the cut HC is provided in the upper face film 29 only in each terminal portion region TMR, but the disclosure is not limited thereto, and the cut HC may be provided in the upper face film 29 in one linear shape connected in the left-right direction in (a) of FIG. 3.

The cut HC can be provided in the upper face film 29 by cutting a part of a thickness of the upper face film 29, for example, cutting (half-cutting) a half of the thickness of the upper face film 29.

As illustrated in (a) of FIG. 3, the short ring 7 included in the short ring portion is provided on a lower side in the diagram of the terminal portions TM1 to TMn in each terminal portion region TMR, and the display region DA is disposed on an upper side of the cut HC in each terminal portion region TMR, and the terminal portions TM1 to TMn and the frame region NA are disposed on a lower side.

Next, as illustrated in FIG. 2 and (b) of FIG. 3, in the singulation step (step S2) by dividing the large film substrate 40 including the plurality of organic EL elements, a layered body including the film substrate 10, the adhesive layer 11, the resin layer 12, the barrier layer 3, a part of the TFT layer 4, and the upper face film 29 is divided to acquire a plurality of singulated flexible organic EL display devices 50. The flexible organic EL display device 50 includes the display region DA and a frame region NA formed so as to surround the display region DA, and a part of the frame region NA (specifically, an end portion of the frame region NA) is the terminal portion region TMR.

In the present embodiment, a case where only a lower portion of the short ring 7 having a frame shape illustrated in (a) of FIG. 3 is left, and an upper portion, a right portion, and a left portion are removed in this singulation step is described as an example, but the disclosure is not limited thereto. In the singulation step, a method for leaving all of the lower portion, the upper portion, the right portion, and the left portion of the short ring 7 having a frame shape illustrated in (a) of FIG. 3, partially peeling only a part of the upper face film 29 that covers the terminal portions TM1 to TMn, then removing the lower portion of the short ring 7 having a frame shape, performing a lighting display inspection, and then removing the other short ring portion (the upper portion, the right portion, and the left portion of the short ring 7 having a frame shape) when the singulated flexible organic EL display device is further divided into a free shape can also be suitably used.

Note that, in the present embodiment, a case where the step (step S1) of providing the cut HC in the upper face film 29 near the terminal portions TM1 to TMn of the large film substrate 40 including the plurality of organic EL elements is performed, and then the singulation step (step S2) by dividing the large film substrate 40 including the plurality of organic EL elements is performed is described as an example. However, the disclosure is not limited thereto, and step S1 described above may be performed after step S2 described above is performed.

Next, as illustrated in FIG. 2 and (c) of FIG. 3, in a step (step S3) of peeling a part of the upper face film 29 near the terminal portions TM1 to TMn, a part of the upper face film 29 that overlaps the terminal portions TM1 to TMn and the short ring 7 is peeled to expose the terminal portions TM1 to TMn. In the step, the terminal portions TM1 to TMn are electrically connected to the short ring 7, and thus a short circuit caused by static electricity that may occur in the step can be reliably suppressed.

(a) of FIG. 4 is a partially enlarged view of a C portion in (c) of FIG. 3. (b) of FIG. 4 is a cross-sectional view taken along a line D-E in (a) of FIG. 4. (c) of FIG. 4 is a diagram illustrating a schematic configuration of the flexible organic EL display device 1 including an end face DM of the terminal portion region formed by dividing a flexible organic EL display device 60 illustrated in (b) of FIG. 4 by a laser taken along a line A'-B' in the diagram that is a portion including the short ring portion.

As illustrated in (a) of FIG. 4 and (b) of FIG. 4, each of lead wiring lines TW1 to TWn from the display region DA is electrically connected to each of the terminal portions TM1 to TMn via each of a plurality of first contact holes CON1.

Each of the terminal portions TM1 to TMn is electrically connected to each of the plurality of short ring wiring lines 15D via each of a plurality of second contact holes CON2.

Each of the plurality of short ring wiring lines 15D is electrically connected to the short ring 7 via each of a plurality of third contact holes CON3.

In the present embodiment, a case where the terminal portions TM1 to TMn and the short ring 7 are formed of the same material as that of a source-drain wiring line SH including a source-drain electrode in the TFT layer 4, and the lead wiring lines TW1 to TWn are formed of the same material as that of a gate electrode GE in the TFT layer 4, and the short ring wiring line 15D is a film doped with the same material as that of a semiconductor film 15 in the TFT layer 4 is described as an example, but the disclosure is not limited thereto.

As illustrated in (b) of FIG. 4, each of the terminal portions TM1 to TMn is exposed from an opening 21c formed in the flattening film 21, and the first contact hole CON1 is formed in an inorganic insulating film 18 and an inorganic insulating film 20, and the second contact hole CON2 and the third contact hole CON3 are formed in an inorganic insulating film 16, the inorganic insulating film 18, and the inorganic insulating film 20.

Further, as illustrated in (a) of FIG. 4 and (b) of FIG. 4, a slit K1 is formed in the inorganic insulating film 16, the inorganic insulating film 18, and the inorganic insulating film 20 in a region between the terminal portions TM1 to TMn and the short ring 7 in which the plurality of short ring wiring lines 15D are formed.

A width in the left-right direction in (a) of FIG. 4 of the slit K1 is preferably formed from an end portion on one side to an end portion on the other side of the flexible organic EL display device 60, and a width in the up-down direction in (a) of FIG. 4 of the slit K1 may be appropriately set in accordance with a width of laser light used to divide the short ring portion.

As illustrated in (b) of FIG. 4, each of the plurality of short ring wiring lines 15D is exposed from the slit K1, and is covered with the flattening film 21. In other words, each of the plurality of short ring wiring lines 15D included in the short ring portion is formed on the barrier layer 3 that is an inorganic film, and each of the plurality of short ring wiring lines 15D is covered with the flattening film 21 that is a resin layer.

Next, as illustrated in FIG. 2 and (c) of FIG. 3, in a step (step S4) of dividing the short ring portion in the singulated flexible organic EL display device 60, the short ring portion including the short ring 7 is divided along the line A-B in the diagram, and the flexible organic EL display device 1 illustrated in (d) of FIG. 3 is acquired.

A divided position of the short ring portion by using the laser light is the line A-B in (a) of FIG. 4, and is the line A'-B' in (b) of FIG. 4.

When the short ring portion is divided by the laser, a temperature rise instantaneously occurs in a divided portion. Thus, when the short ring portion to be divided is formed of a metal film or a semiconductor film and is sandwiched between an inorganic film in a lower layer and an inorganic film in an upper layer, a crack is more likely to be caused due to a difference in linear expansion coefficient.

Thus, in the present embodiment, the slit K1 is formed in the inorganic insulating film 16, the inorganic insulating film 18, and the inorganic insulating film 20, and each of the plurality of short ring wiring lines 15D that are a semiconductor film is covered with the flattening film 21 that is a resin layer.

Further, a difference between a linear expansion coefficient of the barrier layer 3 that is an inorganic film (for example, a linear expansion coefficient $SiO_2$: 0.5E-6/K) and a linear expansion coefficient of the plurality of short ring wiring lines 15D that are a semiconductor film (for example, a linear expansion coefficient Si: 3.9E-6/K) is smaller than a difference between a linear expansion coefficient of the barrier layer 3 that is an inorganic film (for example, a linear expansion coefficient of $SiO_2$: 0.5E-6/K) and a linear expansion coefficient of a metal material (for example, a linear expansion coefficient of Mo: 5.1E-6/K), and thus the plurality of short ring wiring lines 15D are preferably formed with a semiconductor film on the barrier layer 3 that is an inorganic film.

As described above, even when the short ring portion is divided by the laser along the line A'-B' in (b) of FIG. 4 in the flexible organic EL display device 60 illustrated in (b) of FIG. 4, and the flexible organic EL display device 1 including the end face DM of the terminal portion region illustrated in (c) of FIG. 4 is acquired, a crack is less likely to be generated in the end face DM of the terminal portion region in the flexible organic EL display device 1.

As illustrated in (c) of FIG. 4, in the terminal portion region of the flexible organic EL display device 1, the inorganic insulating film 16, the inorganic insulating film 18, and the inorganic insulating film 20 that are one or more layers of inorganic films are formed as upper layers above each of the plurality of short ring wiring lines 15D that are a semiconductor film, and the inorganic insulating film 16, the inorganic insulating film 18, and the inorganic insulating film 20 are formed inside the end face DM of the terminal portion region that intersects each of the plurality of short ring wiring lines 15D.

Next, as illustrated in FIG. 2 and (d) of FIG. 3, in a mounting step (step S5) onto the terminal portions TM1 to TMN of the flexible organic EL display device 1, a flexible wiring line board (not illustrated) is crimped and mounted on the terminal portions TM1 to TMn by an anisotropic conductive material (also referred to as an anisotropic conductive film (ACF)).

Figure 5:
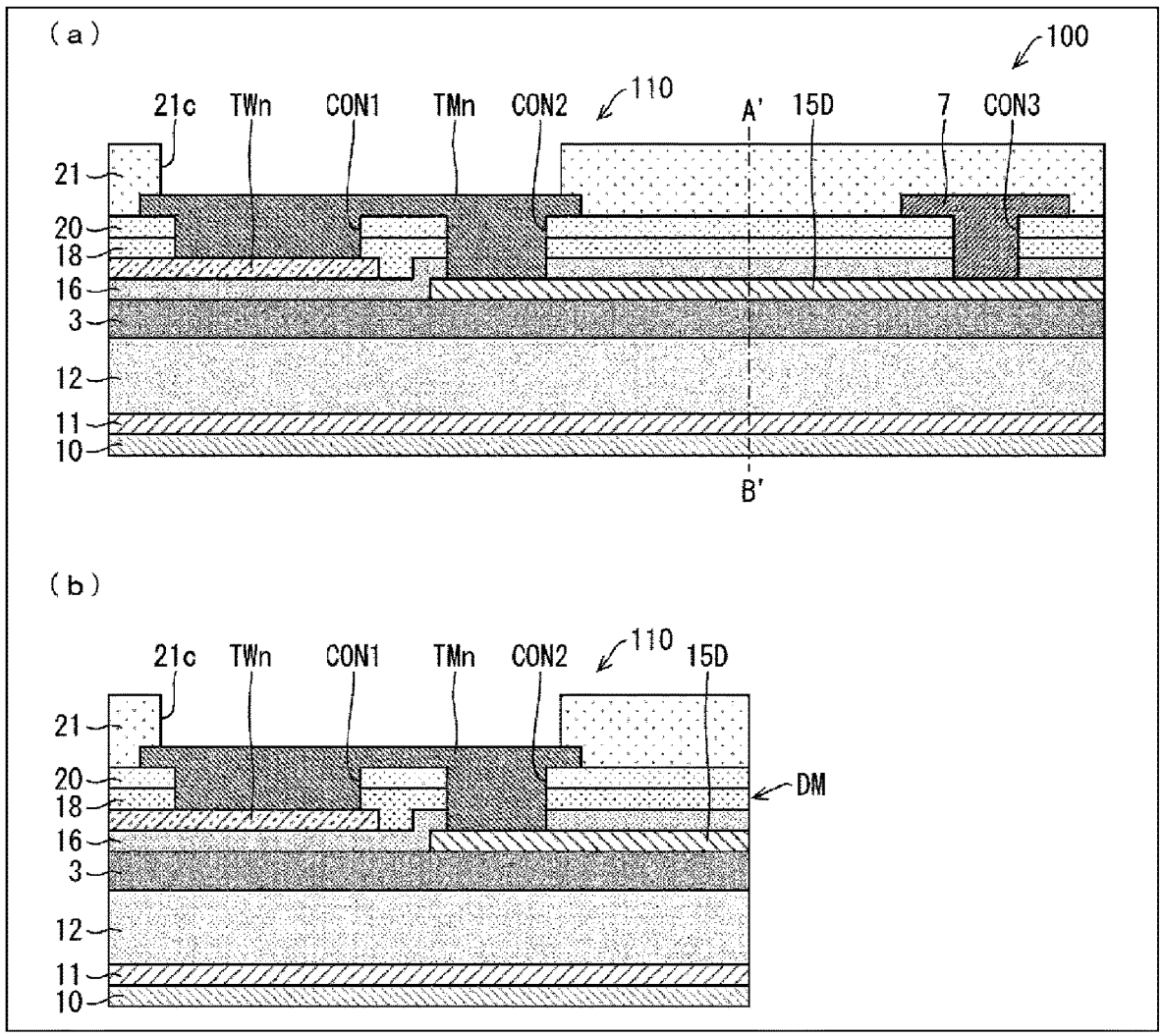
FIG. 5(a) is a diagram illustrating a schematic configuration of a flexible organic EL display device according to a comparative example.
FIG. 5(b) is a diagram illustrating a schematic configuration of a flexible organic EL display device including an end face of a terminal portion region formed by dividing the flexible organic EL display device illustrated in FIG. 5(a) by a laser along a line A'-B' in the diagram that is a portion including a short ring portion.

(a) of FIG. 5 is a diagram illustrating a schematic configuration of a flexible organic EL display device 100 according to the comparative example. (b) of FIG. 5 is a diagram illustrating a schematic configuration of a flexible organic EL display device 110 including an end face DM of a terminal portion region formed by dividing the flexible organic EL display device 100 illustrated in (a) of FIG. 5 by a laser along a line A'-B' in the diagram that is a portion including a short ring portion.

In the flexible organic EL display device 100 illustrated in (a) of FIG. 5, when the short ring portion is divided by the laser along the line A'-B' in the diagram, and the flexible organic EL display device 110 illustrated in (b) of FIG. 5 is acquired, a crack is more likely to be generated in the end face DM of the terminal portion region in the flexible organic EL display device 110.

The reason is that a plurality of short ring wiring lines 15D that are a semiconductor film are sandwiched between a barrier layer 3 that is an inorganic film in a lower layer and an inorganic insulating film 16 that is an inorganic film in an upper layer.

Examples of the material of the film substrate 10 include polyethylene terephthalate (PET), but are not limited thereto.

Examples of the adhesive layer 11 include an optical clear adhesive (OCA) or an optical clear resin (OCR), but are not limited thereto.

Examples of the material of the resin layer 12 include a polyimide resin, an epoxy resin, and a polyamide resin, but are not limited thereto.

The barrier layer 3 is a layer that inhibits moisture or impurities from reaching the TFT layer 4 or the organic EL element layer 5 when the flexible organic EL display device 1 is being used, and may be formed of, for example, a silicon oxide film, a silicon nitride film, or a silicon oxynitride film, or of a layered film of these films, formed by CVD.

The TFT layer 4 is provided on a layer above the resin layer 12 and the barrier layer 3. The TFT layer 4 includes the semiconductor film 15, the inorganic insulating film (gate insulating film) 16 in an upper layer overlying the semiconductor film 15, the gate electrode GE in an upper layer overlying the inorganic insulating film 16, the inorganic insulating film 18 in an upper layer overlying the gate electrode GE, a capacitance wiring line CE in an upper layer overlying the inorganic insulating film 18, the inorganic insulating film 20 in an upper layer overlying the capacitance wiring line CE, the source-drain wiring line SH including the source-drain electrode in an upper layer overlying the inorganic insulating film 20, and the flattening film 21 in an upper layer overlying the source-drain wiring line SH.

A thin layer transistor Tr (TFT) as an active element is formed so as to include the semiconductor film 15, the inorganic insulating film 16, the gate electrode GE, the inorganic insulating film 18, the inorganic insulating film 20, and the source-drain wiring line SH.

The semiconductor film 15 is formed of low-temperature polysilicon (LTPS) or an oxide semiconductor, for example. Note that, although the TFT provided with the semiconductor film 15 as a channel is illustrated as having a top gate structure in FIG. 1, the TFT may have a bottom gate structure (when the TFT channel is an oxide semiconductor, for example).

The gate electrode GE, the capacitance electrode CE, and the source-drain wiring line SH are formed of, for example, a single film or a layered film of metal containing at least one of aluminum (Al), tungsten (W), molybdenum (Mo), tantalum (Ta), chromium (Cr), titanium (Ti), and copper (Cu).

The inorganic insulating films 16, 18, and 20 may be formed of, for example, a silicon oxide (SiOx) film, a silicon nitride (SiNx) film, or a silicon oxynitride film, or of a layered film of these, formed by CVD.

The flattening film (interlayer insulating film) 21 may be formed, for example, of a coatable photosensitive organic material, such as a polyimide resin and an acrylic resin.

Note that, in the flexible organic EL display device 1, a plurality of common layers of inorganic films are formed in the display region DA and the frame region NA, and the plurality of common layers of inorganic films include the barrier layer 3, the inorganic insulating film 16, the inorganic insulating film 18, and the inorganic insulating film 20.

The organic EL element layer 5 includes an anode 22 in an upper layer overlying the flattening film 21, a bank 23 that covers an edge of the anode 22, an electroluminescence (EL) layer 24 in an upper layer overlying the anode 22, and a cathode 25 in an upper layer overlying the EL layer 24, and includes the anode 22 having an island shape, the EL layer 24, and the cathode 25 on a per subpixel SP basis. The bank 23 (anode edge cover) 23 can be formed of a coatable photosensitive organic material, such as a polyimide resin or an acrylic resin, for example. The organic EL element layer 5 forms the display region DA and is provided on a layer above the TFT layer 4.

For example, the EL layer 24 is formed by layering a hole injection layer, a hole transport layer, a light-emitting layer, an electron transport layer, and an electron injection layer in this order, from the lower layer side. The light-emitting layer is formed in an island shape for each subpixel by a vapor deposition method or ink-jet method, but the other layers may be a solid-like common layer. A configuration is also possible in which one or more layers are not formed, out of the hole injection layer, the hole transport layer, the electron transport layer, and the electron injection layer.

The anode (anode electrode) 22 is photoreflective and is formed by layering Indium Tin Oxide (ITO) and an alloy containing Ag, for example. The cathode 25 may be constituted by a transparent conductive material such as Indium Tin Oxide (ITO) or Indium Zinc Oxide (IZO).

Holes and electrons are recombined in the EL layer 24 by a driving current between the anode 22 and the cathode 25 in the organic EL element layer 5, and the excitons generated thereby fall to the ground state such that light is emitted. Since the cathode 25 is transparent and the anode 22 has light reflectivity, the light emitted from the EL layer 24 travels upward and becomes top-emitting.

The sealing layer 6 is transparent, and includes a first inorganic sealing film 26 that covers the cathode 25, an organic sealing film 27 that is formed on the first inorganic sealing film 26, and a second inorganic sealing film 28 that covers the organic sealing film 27. The sealing layer 6 covering the organic EL element layer 5 inhibits foreign matters, such as water and oxygen, from penetrating to the organic EL element layer 5.

Each of the first inorganic sealing film 26 and the second inorganic sealing film 28 may be formed of, for example, a silicon oxide film, a silicon nitride film, or a silicon oxynitride film, or of a layered film of these, formed through CVD. The organic sealing film 27 is thicker than the first inorganic sealing film 26 and the second inorganic sealing film 28, is a transparent organic film, and can be formed of a coatable photosensitive organic material such as a polyimide resin or an acrylic resin.

Examples of the material of the upper face film 29 include polyethylene terephthalate (PET) similarly to the material of the film substrate 10, but are not limited thereto.

Note that the upper face film 29 is preferably bonded by using an adhesive layer having low adhesion while the step of peeling the upper face film 29 is taken into consideration. When the upper face film 29 is peeled, the adhesive layer having low adhesion does not remain on the flexible organic EL display device side, i.e., on the second inorganic sealing film 28 in the display region DA and on the flattening film 21 in the terminal portion region TMR, and is peeled together with the upper face film 29.

Second Embodiment

Next, a second embodiment of the disclosure will be described with reference to FIG. 6. The present embodiment is different from the first embodiment in that a slit K1 is formed in an inorganic insulating film 16, an inorganic insulating film 18, and an inorganic insulating film 20, and each of a plurality of short ring wiring lines 7a that are a metal film is covered with a flattening film 21 that is a resin layer, and other examples are as described in the first embodiment. For convenience of description, members having the same functions as those of the members illustrated in the diagrams in the first embodiment are denoted by the same reference numerals, and descriptions thereof will be omitted.

Figure 6:
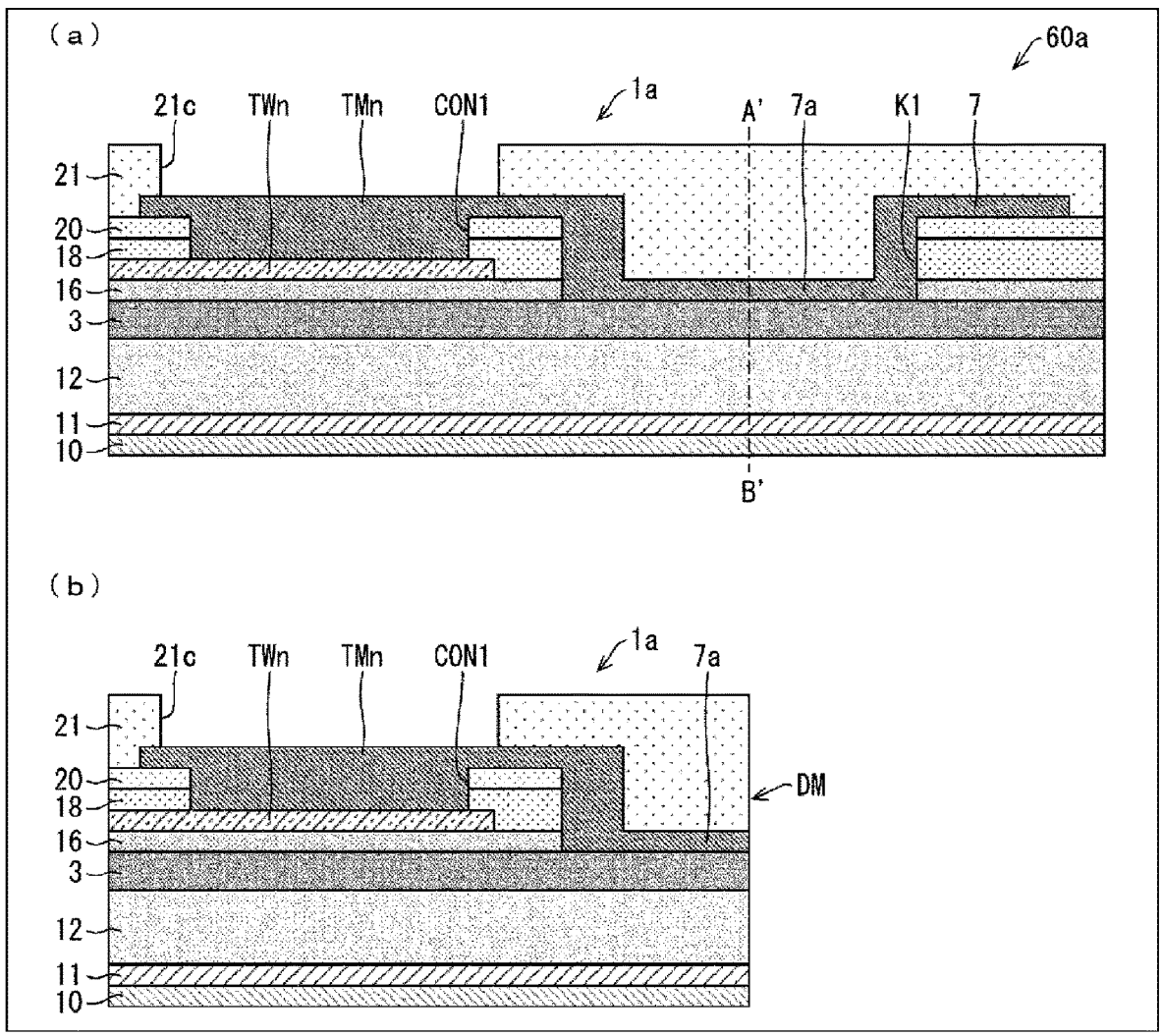
FIG. 6(a) is a diagram illustrating a schematic configuration of a flexible organic EL display device according to a second embodiment.
FIG. 6(b) is a diagram illustrating a schematic configuration of a flexible organic EL display device including an end face of a terminal portion region formed by dividing the flexible organic EL display device illustrated in FIG. 6(a) by a laser along a line A'-B' in the diagram that is a portion including a short ring portion.

(a) of FIG. 6 is a diagram illustrating a schematic configuration of a flexible organic EL display device 60a. (b) of FIG. 6 is a diagram illustrating a schematic configuration of a flexible organic EL display device 1a including an end face DM of a terminal portion region formed by dividing the flexible organic EL display device 60a illustrated in (a) of FIG. 6 by a laser along a line A'-B' in the diagram that is a portion including a short ring portion.

When the short ring portion is divided by the laser along the line A'-B' in (a) of FIG. 6 in the flexible organic EL display device 60a illustrated in (a) of FIG. 6, and the flexible organic EL display device 1a illustrated in (b) of FIG. 6 is acquired, a crack is less likely to be generated in the end face DM of the terminal portion region in the flexible organic EL display device 1a.

The reason is that, also in the present embodiment similarly to the first embodiment, the slit K1 is formed in the inorganic insulating film 16, the inorganic insulating film 18, and the inorganic insulating film 20, and each of the plurality of short ring wiring lines 7a is covered with the flattening film 21 that is a resin layer.

As illustrated in (b) of FIG. 6, in the terminal portion region of the flexible organic EL display device 1a, the inorganic insulating film 16, the inorganic insulating film 18, and the inorganic insulating film 20 other than the barrier layer 3 that is an inorganic layer included in a lower layer in contact with each of the plurality of short ring wiring lines 7a in the end face DM of the terminal portion region are formed as a lower layer of each of terminal portions TM1 to TMn that is the same metal film as each of the short ring wiring lines 7a, and the inorganic insulating film 16, the inorganic insulating film 18, and the inorganic insulating film 20 are formed inside the end face DM of the terminal portion region that intersects each of the plurality of short ring wiring lines 7a.

In the present embodiment, a case where the terminal portions TM1 to TMn, a short ring 7, and each of the plurality of short ring wiring lines 7a are formed of the same material as that of a source-drain wiring line SH including a source-drain electrode in a TFT layer 4 is described as an example, but the disclosure is not limited thereto.

Note that the short ring portion includes the short ring 7 and the plurality of short ring wiring lines 7a electrically connected to the short ring 7, and is electrically connected to the terminal portions TM1 to TMn. For example, the short ring portion suppresses a short circuit caused by static electricity that may occur in the terminal portions TM1 to TMn during a step of peeling a part of an upper face film 29, for example.

Third Embodiment

Next, a third embodiment according to the disclosure will be described with reference to FIG. 7. The present embodiment is different from the first and second embodiments in that a slit K1 and a bending slit CL are formed in a barrier layer 3, an inorganic insulating film 16, an inorganic insulating film 18, and an inorganic insulating film 20 that are an inorganic film in the same step, and a flattening film 31 that is a resin layer fills the slit K1, each of a plurality of short ring wiring lines 7a that are a metal film is formed on the flattening film 31 that is a resin layer, and each of the plurality of short ring wiring lines 7a is covered with a flattening film 21 that is a resin layer, and other examples are as described in the first and second embodiments. For the sake of the description, members having the same functions as the members illustrated in the diagrams in the first and second embodiments are denoted by the same reference numerals, and descriptions thereof will be omitted.

Figure 7:
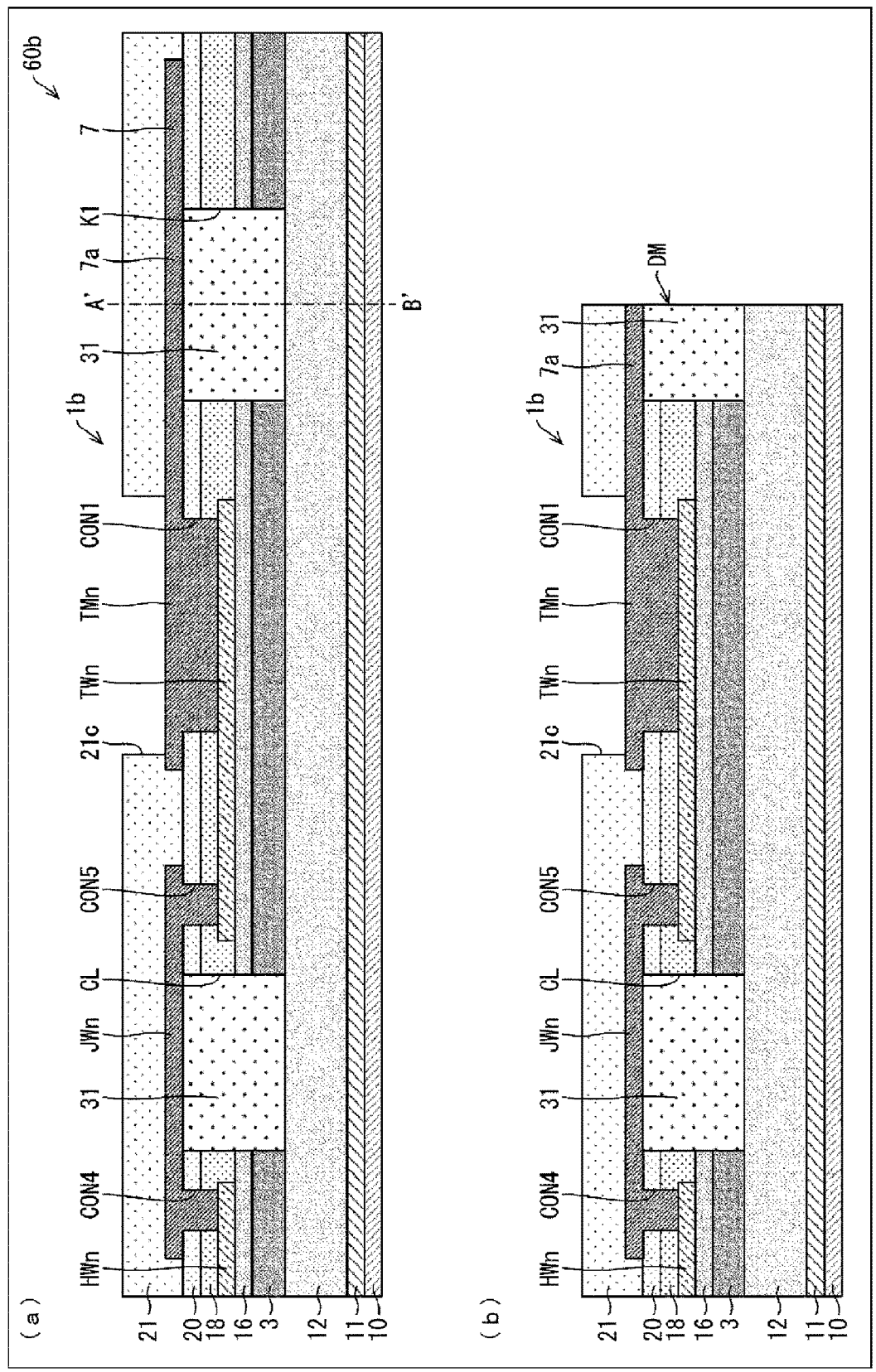
FIG. 7(a) is a diagram illustrating a schematic configuration of a flexible organic EL display device according to a third embodiment.
FIG. 7(b) is a diagram illustrating a schematic configuration of a flexible organic EL display device including an end face of a terminal portion region formed by dividing the flexible organic EL display device illustrated in FIG. 7(a) by a laser along a line A'-B' in the diagram that is a portion including a short ring portion.

(a) of FIG. 7 is a diagram illustrating a schematic configuration of a flexible organic EL display device 60b including the bending slit CL. (b) of FIG. 7 is a diagram illustrating a schematic configuration of a flexible organic EL display device 1b including an end face DM of a terminal portion region formed by dividing the flexible organic EL display device 60b illustrated in (a) of FIG. 7 by a laser along a line A'-B' in the diagram that is a portion including a short ring portion.

When the flexible organic EL display device 60b illustrated in (a) of FIG. 7 is divided by the laser along the line A'-B' in the diagram that is a portion including the short ring portion, and the flexible organic EL display device 1b illustrated in (b) of FIG. 7 is acquired, a crack is less likely to be generated in the end face DM of the terminal portion region formed along the line A'-B' in the diagram in the flexible organic EL display device 1b.

The reason is that each of the plurality of short ring wiring lines 7a that are a metal film is sandwiched between the flattening film 31 that is a resin layer in a lower layer and the flattening film 21 that is a resin layer in an upper layer.

As illustrated in (b) of FIG. 7, in the terminal portion region of the flexible organic EL display device 1b, the barrier layer 3, the inorganic insulating film 16, the inorganic insulating film 18, and the inorganic insulating film 20 are formed as a lower layer of each of terminal portions TM1 to TMn that is the same metal film as each of the short ring wiring lines 7a, and the barrier layer 3, the inorganic insulating film 16, the inorganic insulating film 18, and the inorganic insulating film 20 are formed inside the end face DM of the terminal portion region that intersects each of the plurality of short ring wiring lines 7a.

In the present embodiment, a case where the slit K1 is formed in the barrier layer 3, the inorganic insulating film 16, the inorganic insulating film 18, and the inorganic insulating film 20 that are an inorganic film is described as an example, but the disclosure is not limited thereto. As long as the flattening film 31 that fills the slit K1 and is a resin layer contacts each of the plurality of short ring wiring lines 7a that are a metal film, a depth of the slit K1 can be appropriately determined.

In the present embodiment, a case where the bending slit CL for bending the flexible organic EL display device 1b is formed between a display region DA and the terminal portion TMn in the same step as the step of forming the slit K1, and, similarly to the slit K1, the bending slit CL is formed in the barrier layer 3, the inorganic insulating film 16, the inorganic insulating film 18, and the inorganic insulating film 20 that are an inorganic film is described as an example, but the disclosure is not limited thereto. The step of forming the bending slit CL and the step of forming the slit K1 may be different steps. Further, a depth of the bending slit CL can be appropriately determined, and may be a depth different from a depth of the slit K1.

The bending slit CL can be formed in a shape similar to that of the slit K1, and a length of the bending slit CL corresponding to a width in the left-right direction of the slit K1 (see (a) of FIG. 4) is preferably formed from an end portion on one side to an end portion on the other side of the flexible organic EL display device 60b. A width of the bending slit CL corresponding to a width in the up-down direction of the slit K1 (see (a) of FIG. 4) may be appropriately set according to a width needed when the flexible organic EL display device 60b is bent.

The bending slit CL is filled with the flattening film 31 that is a resin layer, and each of conductive members JW1 to JWn is formed in an island shape on the bending slit CL filled with the flattening film 31. Each of the conductive members JW1 to JWn is electrically connected to each of wiring lines HW1 to HWn from the display region DA via each of a plurality of fourth contact holes CON4, and is also electrically connected to each of lead wiring lines TW1 to TWn from the display region DA via each of a plurality of fifth contact holes CON5.

In the present embodiment, a case where the terminal portions TM1 to TMn, a short ring 7, each of the plurality of short ring wiring lines 7a, and each of the conductive members JW1 to JWn are formed of the same material as that of a source-drain wiring line SH including a source-drain electrode in a TFT layer 4 is described as an example, but the disclosure is not limited to thereto.

Note that the short ring portion includes the short ring 7 and the plurality of short ring wiring lines 7a electrically connected to the short ring 7, and is electrically connected to the terminal portions TM1 to TMn. For example, the short ring portion suppresses a short circuit caused by static electricity that may occur in the terminal portions TM1 to TMn during a step of peeling a part of an upper face film 29, for example.

Supplement

First Aspect

A display device including:
a display region;
a frame region surrounding the display region; and
a terminal portion region formed at an end portion of the frame region,
wherein a plurality of terminal portions that input a signal from the outside, a plurality of first lead wiring lines extending from the plurality of terminal portions, and a plurality of second lead wiring lines extending from the plurality of terminal portions to the display region are included in the terminal portion region,
each of the plurality of first lead wiring lines extends in a direction opposite to a direction in which each of the plurality of second lead wiring lines extends, and intersects an end face of the terminal portion region, and
at least one of an upper layer and a lower layer in contact with each of the plurality of first lead wiring lines on the end face of the terminal portion region is a resin layer.

Second Aspect

In the display device according to the first aspect, the upper layer in contact with each of the plurality of first lead wiring lines on the end face of the terminal portion region is a first resin layer, and the lower layer in contact with each of the plurality of first lead wiring lines on the end face of the terminal portion region is a layered film in which an inorganic layer and a second resin layer are layered in this order from the top.

Third Aspect

In the display device according to the second aspect, the inorganic layer included in the lower layer in contact with each of the plurality of first lead wiring lines on the end face of the terminal portion region is a moisture-proof layer.

Fourth Aspect

In the display device according to the second or third aspect, the second resin layer included in the lower layer in contact with each of the plurality of first lead wiring lines on the end face of the terminal portion region is a polyimide film.

Fifth Aspect

In the display device according to any of the first to fourth aspects, each of the plurality of first lead wiring lines is formed of a semiconductor film.

Sixth Aspect

In the display device according to the fifth aspect, the semiconductor film is a doped semiconductor film.

Seventh Aspect

In the display device according to any of the first to fourth aspects, each of the plurality of first lead wiring lines is formed of a metal film.

Eighth Aspect

In the display device according to any of the first to seventh aspects, each of the plurality of first lead wiring lines and each of the plurality of terminal portions are electrically connected to each other.

Ninth Aspect

In the display device according to the fifth or sixth aspect, one or more layers of inorganic films are formed as an upper layer above the semiconductor film in the terminal portion region, and the one or more layers of inorganic films are formed inside the end face of the terminal portion region that intersects each of the plurality of first lead wiring lines.

Tenth Aspect

In the display device according to any of the second to fourth aspects, each of the plurality of first lead wiring lines is formed of a metal film, one or more layers of inorganic films other than the inorganic layer included in the lower layer in contact with each of the plurality of first lead wiring lines on the end face of the terminal portion region are formed as a lower layer below the metal film in the terminal portion region, and the one or more layers of inorganic films are formed inside the end face of the terminal portion region that intersects each of the plurality of first lead wiring lines.

Eleventh Aspect

In the display device according to the first aspect, each of the plurality of first lead wiring lines is formed of a metal film, the upper layer in contact with each of the plurality of first lead wiring lines on the end face of the terminal portion region is a first resin layer, one or more layers of inorganic films are formed as a lower layer below the metal film in the terminal portion region, the one or more layers of inorganic films are formed inside the end face of the terminal portion region that intersects each of the plurality of first lead wiring lines, a third resin layer is formed between an end face of the one or more layers of inorganic films and the end face of the terminal portion region that intersects each of the plurality of first lead wiring lines, the third resin layer contacting a second resin layer, and the lower layer in contact with each of the plurality of first lead wiring lines on the end face of the terminal portion region is the third resin layer.

Twelfth Aspect

The display device according to the eleventh aspect further includes a bending slit formed between the display region and the plurality of terminal portions by removing the one or more layers of inorganic films, wherein the bending slit is filled with the third resin layer, each of a plurality of conductive members is formed in an island shape on the bending slit filled with the third resin layer, and each of the plurality of second lead wiring lines is electrically connected to each of a plurality of wiring lines from the display region via each of the plurality of conductive members.

Thirteenth Aspect

In the display device according to the twelfth aspect, each of the plurality of conductive members and each of the plurality of first lead wiring lines are formed of an identical metal film.

Fourteenth Aspect

In the display device according to any of the tenth to thirteenth aspects, each of the plurality of first lead wiring lines and the plurality of terminal portions are formed of an identical metal film.

Fifteenth Aspect

A manufacturing method of a display device includes a step of dividing, in a terminal portion region formed at an end portion of a frame region, a display device including a display region, the frame region surrounding the display region, and the terminal portion region, wherein, in the step of dividing the display device in the terminal portion region, the terminal portion region is divided, a portion in which at least one of an upper layer and a lower layer in contact with each of a plurality of wiring lines is a resin layer being included in a film composition of a cross section generated by the division.

Sixteenth Aspect

In the manufacturing method of a display device according to the fifteenth aspect, in the step of dividing the display device in the terminal portion region, the terminal portion region is divided, a portion in which both of the upper layer and the lower layer in contact with each of a plurality of wiring lines are a resin layer being included in the film composition of the cross section generated by the division.

Additional Items

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

INDUSTRIAL APPLICABILITY

The disclosure can be utilized for a display device or a manufacturing method of the display device.

The invention claimed is:

1. A display device comprising:
a display region;
a frame region surrounding the display region; and
a terminal portion region formed at an end portion of the frame region,
wherein a plurality of terminal portions that input a signal from the outside, a plurality of first lead wiring lines extending from the plurality of terminal portions, and a plurality of second lead wiring lines extending from the plurality of terminal portions to the display region are included in the terminal portion region,
each of the plurality of first lead wiring lines extends in a direction opposite to a direction in which each of the plurality of second lead wiring lines extends, and intersects an end face of the terminal portion region, and
at least one of an upper layer and a lower layer in contact with each of the plurality of first lead wiring lines on the end face of the terminal portion region is a resin layer, wherein the upper layer in contact with each of the plurality of first lead wiring lines on the end face of the terminal portion region is a first resin layer, and the lower layer in contact with each of the plurality of first lead wiring lines on the end face of the terminal portion region is a layered film in which an inorganic layer and a second resin layer are layered in this order from a top side of the layered film.

2. The display device according to claim 1, wherein the inorganic layer included in the lower layer in contact with each of the plurality of first lead wiring lines on the end face of the terminal portion region is a moisture-proof layer.

3. The display device according to claim 1, wherein the second resin layer included in the lower layer in contact with each of the plurality of first lead wiring lines on the end face of the terminal portion region is a polyimide film.

4. The display device according to claim 1, wherein each of the plurality of first lead wiring lines is formed of a semiconductor film.

5. The display device according to claim 4, wherein the semiconductor film is a doped semiconductor film.

6. The display device according to claim 1, wherein each of the plurality of first lead wiring lines is formed of a metal film.

7. The display device according to claim 1, wherein each of the plurality of first lead wiring lines and each of the plurality of terminal portions are electrically connected to each other.

8. The display device according to claim 4, wherein one or more layers of inorganic films are formed as an upper layer above the semiconductor film in the terminal portion region, and the one or more layers of inorganic films are formed inside the end face of the terminal portion region that intersects each of the plurality of first lead wiring lines.

9. The display device according to claim 1, wherein each of the plurality of first lead wiring lines is formed of a metal film, one or more layers of inorganic films other than the inorganic layer included in the lower layer in contact with each of the plurality of first lead wiring lines on the end face of the terminal portion region are formed as a lower layer below the metal film in the terminal portion region, and the one or more layers of inorganic films are formed inside the end face of the terminal portion region that intersects each of the plurality of first lead wiring lines.

10. The display device according to claim 9, wherein each of the plurality of first lead wiring lines and the plurality of terminal portions are formed of an identical metal film.

11. A display device comprising:

a display region;

a frame region surrounding the display region; and a terminal portion region formed at an end portion of the frame region, wherein a plurality of terminal portions that input a signal from the outside, a plurality of first lead wiring lines extending from the plurality of terminal portions, and a plurality of second lead wiring lines extending from the plurality of terminal portions to the display region are included in the terminal portion region, each of the plurality of first lead wiring lines extends in a direction opposite to a direction in which each of the plurality of second lead wiring lines extends, and intersects an end face of the terminal portion region, and at least one of an upper layer and a lower layer in contact with each of the plurality of first lead wiring lines on the end face of the terminal portion region is a resin layer, wherein each of the plurality of first lead wiring lines is formed of a semiconductor film.

12. The display device according to claim 11, wherein the semiconductor film is a doped semiconductor film.

13. The display device according to claim 11, wherein each of the plurality of first lead wiring lines and each of the plurality of terminal portions are electrically connected to each other.

14. The display device according to claim 11, wherein one or more layers of inorganic films are formed as an upper layer above the semiconductor film in the terminal portion region, and the one or more layers of inorganic films are formed inside the end face of the terminal portion region that intersects each of the plurality of first lead wiring lines.

15. A display device comprising:

a display region;

a frame region surrounding the display region; and a terminal portion region formed at an end portion of the frame region, wherein a plurality of terminal portions that input a signal from the outside, a plurality of first lead wiring lines extending from the plurality of terminal portions, and a plurality of second lead wiring lines extending from the plurality of terminal portions to the display region are included in the terminal portion region, each of the plurality of first lead wiring lines extends in a direction opposite to a direction in which each of the plurality of second lead wiring lines extends, and intersects an end face of the terminal portion region, and at least one of an upper layer and a lower layer in contact with each of the plurality of first lead wiring lines on the end face of the terminal portion region is a resin layer, wherein each of the plurality of first lead wiring lines is formed of a metal film, the upper layer in contact with each of the plurality of first lead wiring lines on the end face of the terminal portion region is a first resin layer, one or more layers of inorganic films are formed as a lower layer below the metal film in the terminal portion region, the one or more layers of inorganic films are formed inside the end face of the terminal portion region that intersects each of the plurality of first lead wiring lines, a third resin layer is formed between an end face of the one or more layers of inorganic films and the end face of the terminal portion region that intersects each of the plurality of first lead wiring lines, the third resin layer contacting a second resin layer, and the lower layer in contact with each of the plurality of first lead wiring lines on the end face of the terminal portion region is the third resin layer.

16. The display device according to claim 15, further comprising a bending slit formed between the display region and the plurality of terminal portions by removing the one or more layers of inorganic films, wherein the bending slit is filled with the third resin layer, each of a plurality of conductive members is formed in an island shape on the bending slit filled with the third resin layer, and each of the plurality of second lead wiring lines is electrically connected to each of a plurality of wiring lines from the display region via each of the plurality of conductive members.

17. The display device according to claim 16, wherein each of the plurality of conductive members and each of the plurality of first lead wiring lines are formed of an identical metal film.

18. The display device according to claim 15, wherein each of the plurality of first lead wiring lines and the plurality of terminal portions are formed of an identical metal film.

\* \* \* \* \*